(12) United States Patent
Shanley et al.

(10) Patent No.: US 9,633,816 B2
(45) Date of Patent: Apr. 25, 2017

(54) ELECTRON BEAM MICROSCOPE WITH IMPROVED IMAGING GAS AND METHOD OF USE

(71) Applicant: FEI Company, Hillsboro, OR (US)

(72) Inventors: Toby Shanley, Burwood (AU); John Scott, Edgecliff (AU); Milos Toth, Redfern (AU)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/715,432

(22) Filed: May 18, 2015

(65) Prior Publication Data
US 2016/0343537 A1 Nov. 24, 2016

(51) Int. Cl.
*H01J 37/244* (2006.01)
*H01J 37/18* (2006.01)
(Continued)

(52) U.S. Cl.
CPC .............. *H01J 37/18* (2013.01); *H01J 37/22* (2013.01); *H01J 37/244* (2013.01); *H01J 37/28* (2013.01);
(Continued)

(58) Field of Classification Search
CPC .. H01J 37/28; H01J 37/244; H01J 2237/2608; H01J 2237/2605;
(Continued)

(56) References Cited

U.S. PATENT DOCUMENTS 4,785,182 A   11/1988   Mancuso et al.
5,435,850 A    7/1995   Rasmussen
(Continued)

OTHER PUBLICATIONS

Thiel, B. L., et al. "An improved model for gaseous amplification in the environmental Sem." Journal of Microscopy 187.3 (1997): 143-157.*

(Continued)

*Primary Examiner* — Wyatt Stoffa
(74) *Attorney, Agent, or Firm* — Scheinberg & Associates, P.C.; Michael O. Scheinberg

(57) ABSTRACT

Charged particle beam imaging and measurement systems are provided using gas amplification with an improved imaging gas. The system includes a charged particle beam source for directing a charged particle beam to work piece, a focusing lens for focusing the charged particles onto the work piece, and an electrode for accelerating secondary electrons generated from the work piece irradiation by the charged practice beam, or another gas cascade detection scheme. The gas imaging is performed in a high pressure scanning electron microscope (HPSEM) chamber for enclosing the improved imaging gas including $CH_3CH_2OH$ (ethanol) vapor. The electrode accelerates the secondary electrons though the $CH_3CH_2OH$ to ionize the $CH_3CH_2OH$ through ionization cascade to amplify the number of secondary electrons for detection. An optimal configuration is provided for use of the improved imaging gas, and techniques are provided to conduct imaging studies of organic liquids and solvents, and other $CH_3CH_2OH$-based processes.

17 Claims, 9 Drawing Sheets

(51) Int. Cl.
*H01J 37/22* (2006.01)
*H01J 37/28* (2006.01)

(52) U.S. Cl.
CPC . *H01J 2237/182* (2013.01); *H01J 2237/2448* (2013.01); *H01J 2237/2605* (2013.01); *H01J 2237/2608* (2013.01); *H01J 2237/2801* (2013.01); *H01J 2237/2806* (2013.01)

(58) Field of Classification Search
CPC ..... H01J 2237/24445; H01J 2237/2003; H01J 2237/2002
See application file for complete search history.

(56) References Cited

U.S. PATENT DOCUMENTS

| | | | |
|---|---|---|---|
| 5,851,413 A | 12/1998 | Casella et al. | |
| 6,452,315 B1 | 9/2002 | Vane | |
| 6,753,538 B2 | 6/2004 | Musil et al. | |
| 6,972,412 B2 | 12/2005 | Scholtz et al. | |
| 7,541,580 B2* | 6/2009 | Knowles | G01N 23/225 250/310 |
| 7,791,020 B2 | 9/2010 | Uncovsky et al. | |
| 8,299,432 B2* | 10/2012 | Toth | H01J 37/244 250/306 |
| 8,617,668 B2 | 12/2013 | Toth et al. | |
| 8,921,811 B2 | 12/2014 | Toth et al. | |
| 9,086,343 B2* | 7/2015 | Shiono | H01J 37/20 |
| 2005/0173644 A1 | 8/2005 | Gnauck et al. | |
| 2011/0031394 A1 | 2/2011 | Knowles et al. | |
| 2012/0112062 A1* | 5/2012 | Novak | H01J 37/18 250/307 |
| 2014/0264018 A1* | 9/2014 | Miwa | G01B 15/02 250/307 |

OTHER PUBLICATIONS

Fletcher, A. L., B. L. Thiel, and A. M. Donald. "Amplification measurements of alternative imaging gases in environmental Sem." Journal of Physics D: Applied Physics 30.15 (1997): 2249.*

Ichikawa, Tsuneki, et al., "Solvation of Benzophenone Anion Radical in Ethanol and Ethanol/2-Methyltetrahydrofuran Mixture," The Journal of Physical Chemistry, American Chemistry Society, 1988, pp. 508-511, vol. 92, No. 2.

Lobo, Charlene J., et al., "Electron beam induced chemical dry etching and imaging in gaseous NH3 environments," Nanotechnology, 2012, pp. 1-7, vol. 23, No. 375302.

Patterson, Darrell A., et al., "Membrane characterisation by SEM, TEM and ESEM: The implications of dry and wetted microstructure on mass transfer through integrally skinned polyimide nanofiltration membranes," Separation and Purification Technology, 2009, pp. 90-97, vol. 66.

Vladar, Andras E., et al., "Active Monitoring and Control of Electron Beam Induced Contamination," National Inst of Standard, ML34344-105, ftp://ftp.nist.gov/pub/mel/andras/Contamination/SPIE%20Contami%20paper.pdf (2001).

Homma Yoshikazu et al., "Suspended architecture formation process of single-walled carbon nanotubes," Applied Physics Letters, Jan. 12, 2016, vol. 88, No. 2, 3 pages.

* cited by examiner

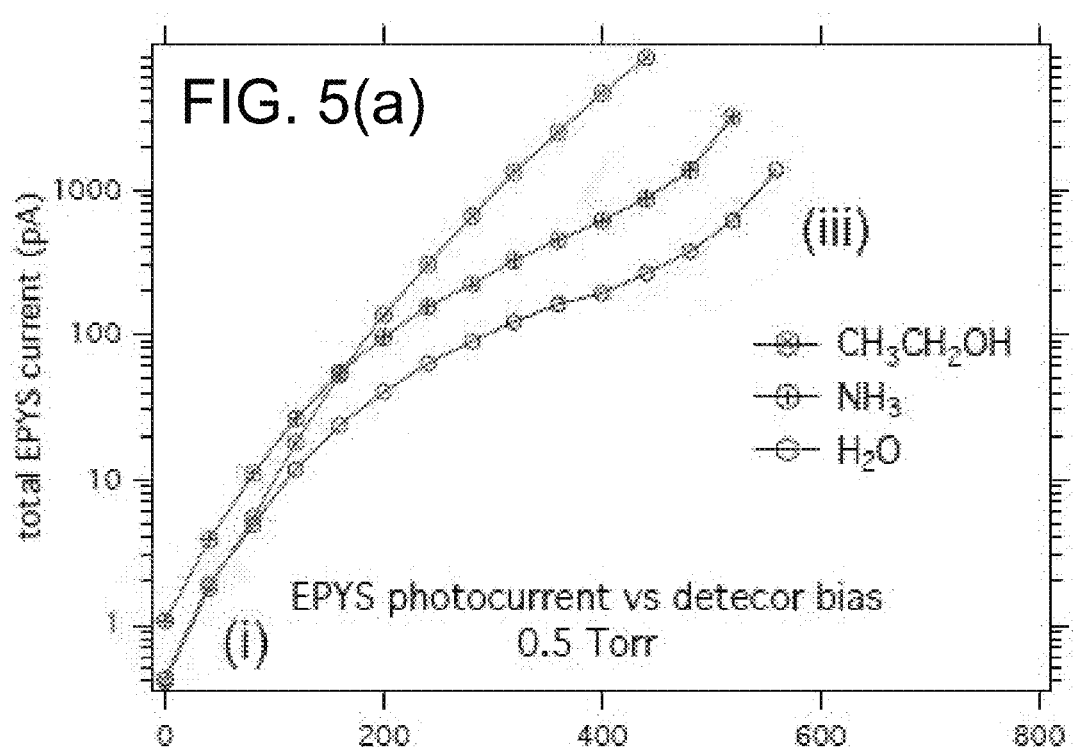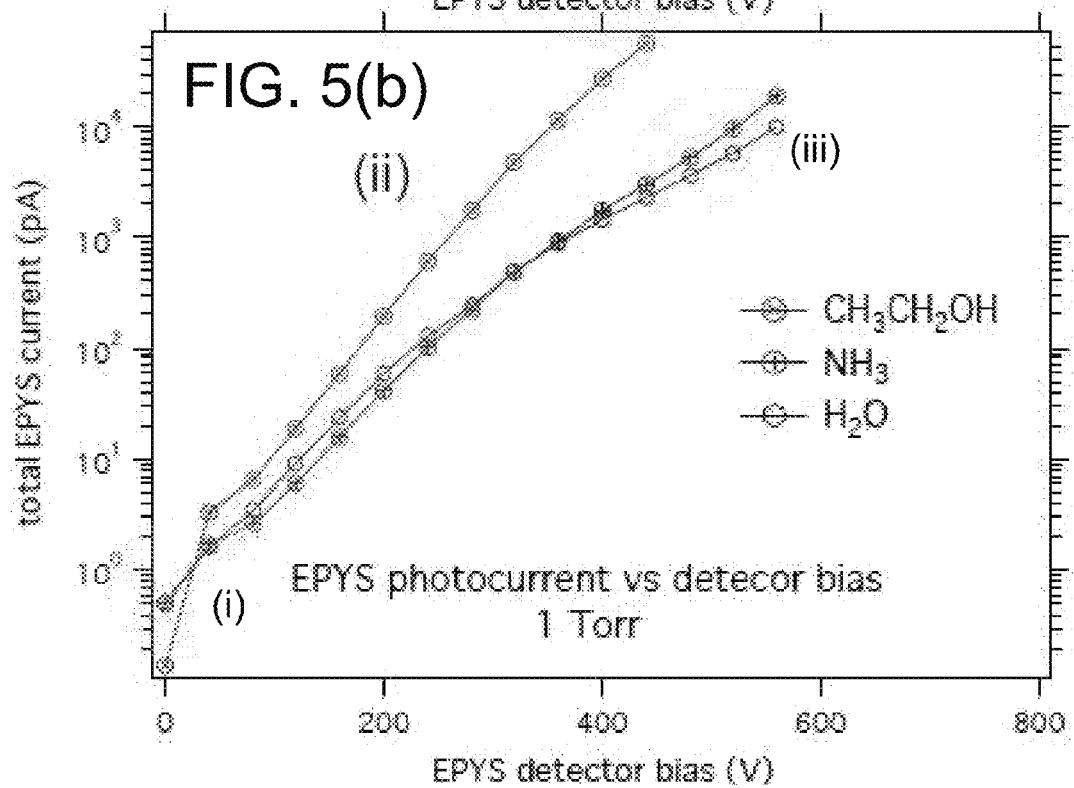

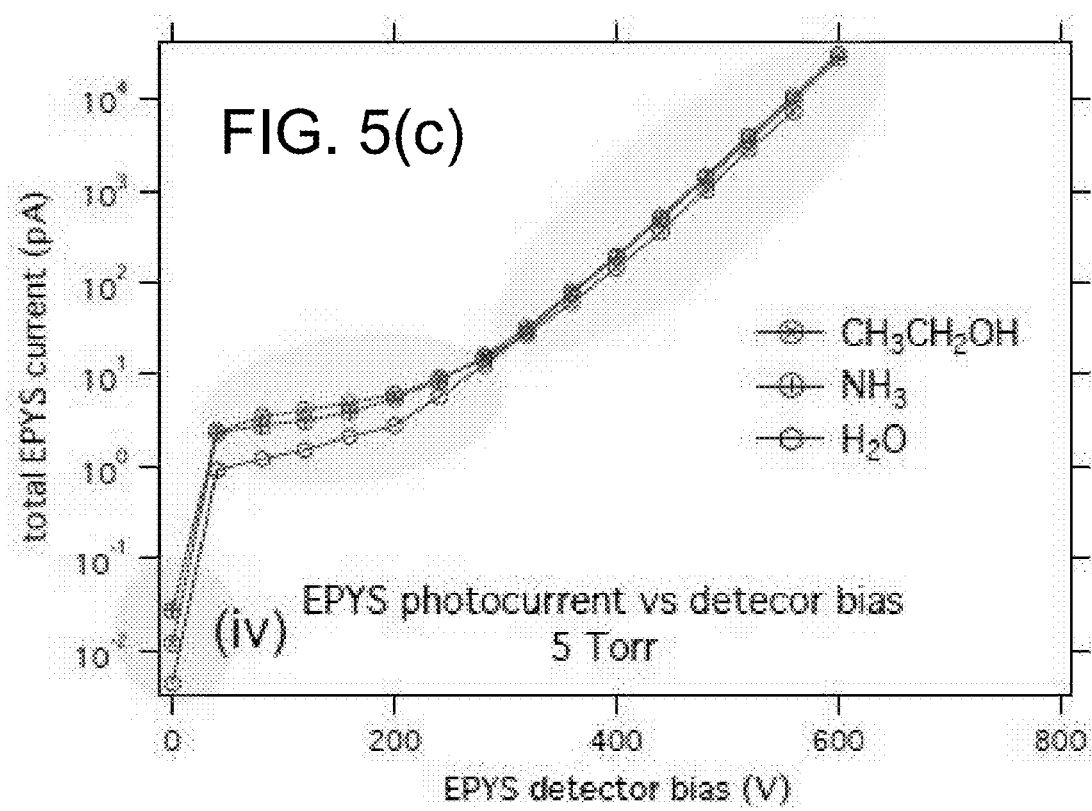

ELECTRON BEAM MICROSCOPE WITH IMPROVED IMAGING GAS AND METHOD OF USE

TECHNICAL FIELD

The present invention relates to charged particle beam imaging, and in particular to imaging using an improved imaging gas.

BACKGROUND OF THE INVENTION

In a scanning electron microscope ("SEM"), a primary beam of electrons is scanned upon a region of a sample that is to be investigated. The energy released in the impact of the electrons with the sample causes the emission of x-rays and secondary electrons. The quantity and energy of these x-rays and secondary electrons provide information on the nature, structure and composition of the sample. The term "sample" is traditionally used to indicate any work piece being processed or observed in a charged particle beam system and the term as used herein includes any work piece and is not limited to a sample that is being used as a representative of a larger population. The term "secondary electrons" as used herein includes backscattered primary electrons, as well as low energy electrons originating from the sample. To detect secondary electrons, a SEM is often provided with one or more electron detectors.

One type of electron microscope in which the sample is maintained in a gaseous environment is a High Pressure Scanning Electron Microscope (HPSEM) or Environmental Scanning Electron Microscope. Such a system is described, for example, in U.S. Pat. No. 4,785,182 to Mancuso et al., entitled "Secondary Electron Detector for Use in a Gaseous Atmosphere." An example is the Quanta 600 ESEM® high pressure SEM from FEI Company.

In an HPSEM, the sample is maintained in a gaseous atmosphere having a pressure typically between 0.01 Torr (0.013 mbar) and 50 Torr (65 mbar), and more typically between 1 Torr (1.3 mbar) and 10 Torr (13 mbar). The region of high gas pressure is limited to the sample region by one or more pressure-limiting apertures that maintain a high vacuum in the focusing column. By contrast, in a conventional SEM the sample is located in vacuum of substantially lower pressure, typically less than $10^{-5}$ Torr ($1.3 \times 10^{-5}$ mbar).

In an HPSEM, secondary electrons are typically detected using a process known as "gas ionization cascade amplification" or "gas cascade amplification," in which the secondary charged particles are accelerated by an electric field and collide with gas molecules in an imaging gas to create additional charged particles, which in turn collide with other gas molecules to produce still additional charged particles. This cascade continues until a greatly increased number of charged particles are detected as an electrical current at a detector electrode. In some embodiments, each secondary electron from the sample surface generates, for example, more than 20, more than 100, or more than 1,000 additional electrons, depending upon the gas pressure and the electrode configuration. In some embodiments positive gas ions or photons generated in the gas cascade are detected instead of electrons and used to generate an image. The term "gas cascade amplification imaging" as used herein refers to images generated using any combination of these three imaging signals. The term "gas cascade detector" as used herein refers to a detector that can be used to detect any combination of these three imaging signals.

One advantage of an HPSEM as compared to a conventional SEM is that the HPSEM offers the possibility of forming electron-optical images of moist samples, such as biological samples, and other samples which, under the high vacuum conditions in a conventional SEM, would be difficult to image. An HPSEM provides the possibility of maintaining the sample in its natural state; the sample is not subjected to the disadvantageous requirements of drying, freezing or vacuum coating, which are normally necessary in studies using conventional SEMs. Another advantage of an HPSEM is that the ionized imaging gas facilitates neutralization of electrical charges that tend to build up on insulating samples, such as plastics, ceramics or glasses.

While an HPSEM can observe moist biological samples, problems still exist with such observations. For example, when hydrated materials are observed at room or body temperature, water tends to condense on all surfaces within the sample chamber. Such condensation can interfere with the operation of HPSEM, as well as cause corrosion and contamination.

Charged particle beams, such as electron beams or ion beams, can also be used to induce a chemical reaction to etch a sample or to deposit material onto a sample. Such processes are described, for example, in U.S. Pat. No. 6,753,538 to Mucil et al. for "Electron Beam Processing." The process of a charged particle beam interacting with a process gas in the presence of a substrate to produce a chemical reaction is referred to as "beam chemistry." The term "processing" as used herein includes both processing that alters the sample surface, such as etching and deposition, as well as imaging. The term "processing gas" is used to include a gas that is used for imaging or a gas that is used together with the charged particle beam to alter the sample. The term "imaging gas" is used to include a gas that is used for gas cascade amplification imaging. The classes of gasses are not mutually exclusive, and some gases may be used for both altering the sample and for forming an image. For example, water vapor can be used to etch a sample that includes carbon and can be used to form an image of samples that include other materials.

Generally, the applicability of existing HPSEM & VPSEM tools for gas imaging is limited, in part, by several factors: First, low secondary electron (SE) image quality relative to that of high vacuum SEM. This problem is a consequence of the fact that the gas cascade is a poor amplifier of the SE imaging signal (compared to amplifiers employed by high vacuum SE detectors). Second, a lack of imaging gases that can be used for high quality imaging of liquids and dynamic processes in non-aqueous environments. Third, problems caused by residual contaminants present in vacuum systems that frequently use low-volatility ("sticky") imaging gases such as $H_2O$ and $NH_3$.

SUMMARY OF THE INVENTION

An object of the invention is to provide an imaging gas for use with gas cascade amplification.

Charged particle beam imaging and measurement systems are provided using gas amplification with an improved imaging gas. The systems include a charged particle beam source for directing a charged particle beam to work piece, a focusing lens for focusing the charged particles onto the work piece, and an electrode for accelerating secondary electrons generated at the work piece irradiated by the charged practice beam, or another gas cascade detection scheme. The gas imaging is preferably performed in a high pressure scanning electron microscope (HPSEM) chamber that encloses the improved imaging gas including $CH_3CH_2OH$ (ethanol) vapor. Environmental chambers may also be used.

The electrode accelerates the secondary electrons through the $CH_3CH_2OH$, generating an ionization cascade that amplifies the secondary electrons for detection. An optimal configuration is provided for use of the improved imaging gas, and techniques are provided to conduct imaging studies of organic liquids and solvents, and other non-aqueous environments or processes, especially those involving $CH_3CH_2OH$. Methods are also provided to conduct high-resolution imaging studies of non-aqueous environments, including organic liquids or solvents, chemical vapor deposition processes, and catalysis processes. Methods of studying wetting behavior in non-aqueous environments are provided.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions and the accompanying drawings, in which:

FIGS. 5a-c are a series of charts showing environmental photoyield spectroscopy (EPYS) data comparing gas amplification of $CH_3CH_2OH$ configured as described herein with that of prior imaging gasses.

DETAILED DESCRIPTION OF PREFERRED EMBODIMENTS

Figure 1:
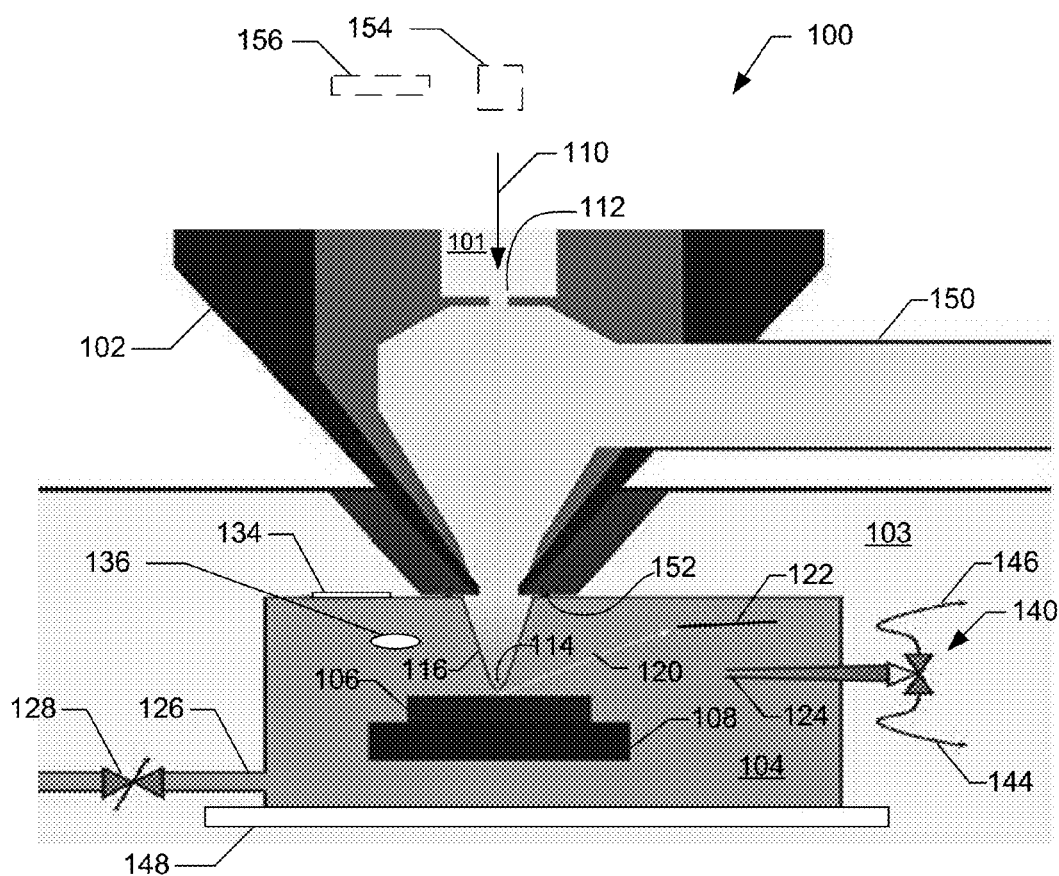
FIG. 1 is a schematic view of a system having an environmental cell that can be used to implement some embodiments of the invention.

Provided are imaging or measurement systems and methods implemented using a high pressure or variable pressure SEM that employs an improved imaging gas and is configured for gas cascade amplification. Also provided are devices for generating, amplifying and detecting secondary electrons from a surface of a sample. An imaging gas is provided that can be used for high quality imaging of liquids and dynamic processes in non-aqueous environments. The preferred device comprises a vacuum envelope having a pressure limiting aperture, with a charged particle beam source located within the vacuum envelope and capable of emitting a charged particle beam. A focusing lens directs the charged particle beam through the pressure limiting aperture into a variable pressure chamber and toward a sample platform disposed outside the vacuum envelope. The chamber is supplied with $CH_3CH_2OH$ or a mixture thereof as an imaging gas, and is preferably capable of maintaining a sample enveloped in gas at a pressure of at least 0.01 Torr such that a surface of the sample may be exposed to a charged particle beam. The present invention alleviates certain problems present in prior art systems by employing $CH_3CH_2OH$ as the HPSEM/VPSEM imaging gas, providing a system that can be used with lower pressures than typical imaging gasses but provide adequate gas cascade amplification for imaging.

Other embodiments also provide a scanning electron microscope for producing high resolution images, which includes a vacuum envelope having a pressure limiting aperture, an electron beam source located within the vacuum envelope and capable of emitting an electron beam. A focusing lens located within the vacuum envelope is capable of directing an electron beam emitted by the electron beam source through the pressure limiting aperture. An electron beam scanner scans the beam across the pressure limiting aperture. A sample cell or sample chamber is disposed outside the vacuum envelope and capable of maintaining a sample enveloped in the $CH_3CH_2OH$ imaging gas at a pressure of at least 0.01 Torr such that a surface of the sample may be exposed to the electron beam.

An electrode is disposed outside of the vacuum envelope and typically positioned within between about 1 and 200 mm of the sample platform such that secondary electrons emitted from a surface of a sample located on the sample platform, and exposed to the electron beam, may come into contact with it. A voltage source is connected between the electrode and an electrical ground and capable of maintaining an electrical potential difference between the electrode and the sample platform of greater than about 50 volts and less than about 1000 volts, the electrode potential being positive relative to the sample platform potential, so as to accelerate secondary electrons emitted from a surface of the sample with an electric field of sufficient strength so as to cause emitted secondary electrons to collide with gas molecules and produce negative charge carriers which can subsequently produce additional negative charge carriers through multiple collisions with other gas molecules resulting in a number of negative charge carriers greater than and proportional to the number of original secondary electrons, the strength of the electric field being sufficiently low so as to avoid catastrophic electrical discharging or arcing, a current amplifier connected to the electrode and current detector connected between the current amplifier and an electrical ground.

Also provided are methods for generating, amplifying and detecting secondary electrons emitted from a surface of a sample. A preferred method includes scanning the surface of the sample under a suitable gaseous pressure with $CH_3CH_2OH$ provided as an imaging gas. The scan is performed with a charged particle beam having a sufficient energy so as to cause secondary electrons to be emitted from the surface of the sample. The secondary electrons are accelerated with an electric field of sufficient strength so as to cause them to collide with gas molecules and produce negative charge carriers which can subsequently produce additional negative charge carriers through multiple collisions with other $CH_3CH_2OH$ gas molecules resulting in a number of negative charge carriers greater than and proportional to the number of original secondary electrons, the strength of the electric field being sufficiently low so as to avoid catastrophic electrical discharging or arcing. The electrical current resulting from electrons and ionized $CH_3CH_2OH$ gas molecules is detected, thereby detecting a signal proportional to the number of secondary electrons emitted from the surface of the sample.

FIG. 1 shows a system using an environmental cell or sample cell 104 that can be filled with an imaging gas and comprising a particle-optical apparatus 100 having a pinhole magnetic objective focusing lens 102, a sample chamber 103 having within it a sample cell 104 for maintaining a sample 106 at a relatively high pressure on a sample stage 108. A particle source (not shown) is provided provide located within a vacuum envelope 101. The particle source provides a primary electron beam 110 that passes through an upper pressure limiting aperture (PLA) 112 and a lower PLA 114 at the bottom of a cone 116, each PLA presenting a low pressure side toward the vacuum envelope 101 and a high pressure side away from envelope 101. Note that a multi-stage PLA is shown, having a duct 150 for evacuating gasses, some embodiments may include only a single PLA with no duct 150. Cone 116 reduces the path of the electron beam 110 through the gas in cell 104. Secondary electrons 120 emitted from the sample are detected by a secondary electron detector 122 built into cell 104 and positioned to enable detection inside environmental cell 104.

This system uses a detector 122 positioned apart from the specimen stage. While detector 122 is shown in this embodiment, any suitable gas cascade detector may be employed in other embodiments, including a gas cascade detector that detects multiple phenomena. The distance between detector 122 and the sample provides a sufficient electron path for collisions between electrons leaving the sample and the gas to significantly amplify the electron current. For example, there are typically more than 300 electrons, more than 500 electrons, or more than 1000 electrons reaching detector 122 for each electron leaving the sample. The charged particle source is preferably an electron beam operated at between 500 eV and 50 keV with a current of between 1 pA and 100 nA. In some embodiments, the electron beam has an energy of 20 keV and a beam current of about 2 nA. These parameters may, of course, vary depending on the application. Detector 122 is preferably biased within the range of about 50 V to about 400 V, but may be slightly higher than 400 V such as, for example, 425 or 450 V, and thereby detects a current induced by the flow of charge in the gas cascade to form an image. In other embodiments, a photon detector can be used to detect photons emitted from the cascade to form an image using a gas cascade amplification imaging system. The photons are emitted by excited ions, fragments or neutrals, either in the gas or upon contact with internal surfaces of the system.

A gas input 124 and a gas output 126 regulate the flow rate and pressure of a process or imaging gas inside the sample cell 104. A source of a precursor or imaging gas is provided through gas input 124. In this embodiment, the imaging gas is $CH_3CH_2OH$ (ethanol vapor) or a mixture thereof. Gas output 126 is connected through a leak valve 128 to a pump (not shown). A controlled leak through valve 128 and the relatively small volume of cell 104 compared to the volume of sample chamber 103 provides for rapid switching between different processing gases, for example, to switch between a HPSEM beam chemistry mode and HPSEM imaging mode. Particle-optical apparatus 100 can function at relatively high pressure, that is, greater than 20 Torr (26 mbar). Particle-optical apparatus 100 can also function at 50 Torr (65 mbar) or higher. In some embodiments, the pressure in the cell 104 is greater than 50 mTorr, while the pressure in the sample chamber 103 is less than 10 mTorr.

Secondary electron detector 122, which is shown in the form of a needle but can also have different geometries such as a ring or a plate, is electrically biased, usually to more than 50V and preferably more than 100V, more preferably greater than 300V, and most preferably about 500 volts to attract secondary electrons, which collide with gas molecules between sample 106 and secondary electron detector 122 to create an ionization cascade to amplify the secondary electron signal. While detector 122 is shown as a needle, it may also take other forms.

In other high pressure charged particle systems, detectors can comprise one or more circular plates, such as the detectors described in U.S. Pat. No. 8,921,811, to Toth et al., titled "High Pressure Charged Particle Beam System," U.S. Pat. No. 6,972,412 to Scholtz et al., titled "Particle-Optical Device and Detection Means," or U.S. Pat. No. 7,541,580 to Knowles et al., titled "Detector for Charged Particle Beam Instrument," all of which are assigned to the assignee of the present invention and are hereby incorporated by reference. Because such detectors have low efficiencies at high pressures, they have improved properties at pressures lower than those of the embodiment shown in FIG. 1, and therefore may derive enhanced benefit from use with the $CH_3CH_2OH$ imaging schemes described herein, which have superior performance at lower pressures than other known imaging gasses. Such an alternative detector may use a combination of electric and magnetic fields to increase the secondary electron path length, thereby providing increased gas signal amplification with a reduced distance between the sample 106 and the detector. The combination of cone 116 with the configuration of secondary electron detector 122, which is positioned outside of the cone, allows for a sufficient secondary electron path within the gas to provide adequate secondary electron signal amplification, while maintaining a short primary electron path through the gas. The secondary electron path from the sample to the detector is typically between 1 and 200 mm, and is preferably greater than 2 mm. In one preferred version the path is about 10 mm, and in another preferred version the path is about 13.5 mm. An optically transparent window 134 allows a user to observe the sample through an optical microscope (not shown) using a lens 136 positioned between window 134 and sample 106. The optical window 134 allows system 100 to provide a wide field of view, while still providing a short gas path length and a low rate of gas leakage into the column, which improves resolution and image signal-to-noise ratio, and protects the column from corrosive gases.

Gas input 124 feeds gas under pressure into sample cell 104. Gas input 124 includes a valve arrangement 140 that allows for rapid switching between multiple gas feeds, such as one or more process gas feeds 144 and an imaging gas feed 146 which includes $CH_3CH_2OH$. A duct 150 allows for evacuation of gases that pass through PLA 114, thereby helping to maintain a lower column pressure above upper PLA 112. A stage 148 supports the sample cell, which can be the stage from a conventional HPSEM/VPSEM or a low pressure SEM into which cell 104 is placed, allows the position of cell 104 to be adjusted so that PLA 114 is aligned with the axis of electron beam 110, while sample stage 108 allows movement of the sample 106 within cell 104 so that a region of interest on the sample 106 can be positioned under the electron beam 110. A seal 152, such as a Viton o-ring or a Teflon seal, preferably provides a gas-tight seal between lens 102 and cell 104 to prevent gases from cell 104 entering sample chamber 103. Seal 152 could also be a non-gas tight seal provided by a small gap that acts as a gas flow restriction between the sub-chamber and sample chamber 103.

The invention is not limited to using a gas cascade detector inside the cell. Other types of detectors, such as gas luminescence detectors or a through-the-lens style detector positioned about the PLA, could also be used. In a through-the-lens style detector, voltages are applied to draw the secondary particles back through the final lens, where they can be detected by an on-axis or off axis collection system, such as a multichannel plate or a scintillator photomultiplier. FIG. 1 shows an optional secondary electron deflector 154, such as a Wien filter, that defects secondary electrons away from the primary beam axis and into detector 156, while passing the primary beam 110 without deviation. Further, the detector can also be that of other suitable systems that use gas cascade amplification as described, for example, in U.S. Pat. No. 4,785,182 to Mancuso et al., entitled "Secondary Electron Detector for Use in a Gaseous Atmosphere," U.S. Pat. No. 6,972,412 for "Particle-Optical Device and Detection Means," to Scholtz et al., and U.S. Pat. No. 7,791,020, for "Multistage Gas Cascade Amplifier," to Uncovsky et al., which are assigned to the assignee of the present invention and are hereby incorporated by reference.

Some embodiments use a sample cell similar to that described to perform charged particle beam processing using a precursor gas, in addition to using $CH_3CH_2OH$ for imaging. The cell is typically positioned in a sample chamber of charged particle beam system, although the sample chamber itself can be constructed as a cell. A pressure limiting aperture maintains a lower pressure outside of the cell. A cell can be positioned inside a conventional high vacuum SEM chamber to provide the HPSEM processing capability, or the cell can be positioned inside an HPSEM sample chamber to provide a higher pressure capability and the capability to use corrosive gases. There are several advantages to using an HPSEM for beam chemistry. Unlike high vacuum SEM beam chemistry processing in which the processing rate is limited by the rate at which the relatively low flux of precursor molecules arrives at the substrate, processing in an HSPEM at high electron fluxes is not so limited. Moreover, an HPSEM provides for charge neutralization during processing. With some process gases, the effect on the sample can be changed from etching to deposition by changing the primary beam current density. Moreover, the pressure at the sample can be measured unambiguously by measuring the cell background pressure.

There are many applications in which it is advantageous to use multiple gases simultaneously. For example, one gas can be used for beam chemistry deposition or etching, while a second gas is added to improve imaging and to suppress charging artifacts. For example, $XeF_2$ can be used as a precursor gas for electron beam induced etching of an $SiO_2$ sample, and $CH_3CH_2OH$ can be added to the etching gas to improve gas cascade amplification imaging and to reduce charging of the sample. In yet another example, $W(CO)_6$ vapor may be used as a precursor gas for electron beam induced deposition of W, and $CH_3CH_2OH$ can be added to the deposition gas to improve gas cascade amplification imaging. In some applications, one gas can be provided for etching, while another gas is provided simultaneously for deposition. A third gas, in this case $CH_3CH_2OH$, can be added to the etching and deposition gas to improve imaging.

It is noted that most of the techniques herein employ $CH_3CH_2OH$, ethanol vapor, as an imaging gas and sometimes as a process gas. While in prior systems, $NH_3$ has been considered to be the most efficient HPSEM imaging gas, followed closely by $H_2O$, the present inventors have found that the gas amplification efficiency of $CH_3CH_2OH$ as configured herein is over one order of magnitude greater than that of $NH_3$. $CH_3CH_2OH$ employed as an imaging gas is a better amplifier in at least two respects. First, the gas gain is greater than that of $NH_3$ (and $H_2O$) under certain conditions. Second, the ultimate gain that can be reached before the gas breaks down is also, under certain conditions, greater than that of $NH_3$ (or $H_2O$). The superior amplification behavior of ethanol was measured in an HPSEM, and further using environmental photoyield spectroscopy (EPYS). In EPYS, photoelectrons are amplified in a gas cascade, just as secondary electrons are amplified in HPSEM. However, EPYS does not contain backscattered and primary electrons, and so enables direct measurement of gas amplification efficiency of low energy electrons, in the absence of the primary and backscattered components.

It is also noted that the $CH_3CH_2OH$ molecule is larger than $H_2O$ and $NH_3$, and hence gives rise to a greater degree of beam scattering than $H_2O$ and $NH_3$. However, beam scatter can be suppressed by minimizing the electron beam path length in the gas, and VPSEM/HPSEM image quality is found to be typically limited by gas cascade amplification rather than beam scatter.

As discussed above, HPSEM/VPSEM uses a gas cascade current initiated by electrons to generate an image. Primary electrons (PEs) and backscattered electrons (BSEs) contribute to the total cascade current, however only the contribution from the secondary electrons ($I_\delta$) supplies topological contrast information, as provided it the following equation:

$$I_\Sigma = I_0 + I_\eta + I_\delta \qquad (1)$$

where $I_\Sigma$ is the total gas cascade current measured across the sample-detector gap in ESEM, $I_0$ and $I_\eta$ are the contributions initiated by PEs and BSEs respectively. Topographic image contrast is determined by the value of $I_\delta$, which is difficult to directly measure with ESEM due to the presence of higher energy PEs and BSEs. However it is possible to determine the value of $I_\delta + I_\eta$ (herein denoted by $I_{\delta+\eta}$), which can be used as a guide for the study of gas amplification efficiency. This value $I_{\delta+\eta}$ can be compared with the amplified photocurrent generated in EPYS ($I_P$), which is devoid of any contributions from high energy electrons, and directly measured as the positive ion (PI) current through the specimen stage. Differences between the two values $I_{\delta+\eta}$ and $I_P$ can be attributed to variations in the inelastic scattering cross-sections of each gas, which are a function of electron energy.

In EPYS, the $I_P$ current generated upon panchromatic illumination yields complimentary data to the ESEM measurements conducted by the inventors, in that the initial electron energy distribution triggering the EPYS gas cascade is similar to the energy distribution of low energy secondary electrons in ESEM. In both cases, the gas cascade amplification current may be plotted as a function of detector bias and gas pressure. Logarithmic plots of the values from panchromatic EPYS data are shown at 0.5, 1 and 5 Torr in FIGS. 5 (a), (b) and (c) respectively. Beam and sample parameters were identical in each case (20 keV beam energy, 2.06 nA beam current with a sample-detector gap of 13.47 mm). The greatest $I_P$ achieved was over 60 nA in 1 Torr of $CH_3CH_2OH$ vapor at 440 V, surpassing the optimized 30 nA and 28 nA produced in $H_2O$ and $NH_3$ respectively. The efficiency of ethanol diminishes rapidly as the pressure is increased however, and $H_2O$ generally becomes a better amplification medium beyond approximately 5 Torr, although $CH_3CH_2OH$ may be considered superior at even higher pressures for applications sensitive to $H_2O$, such as processing of materials that are susceptible to oxidation, and imaging of organic liquids.

Figure 2A:
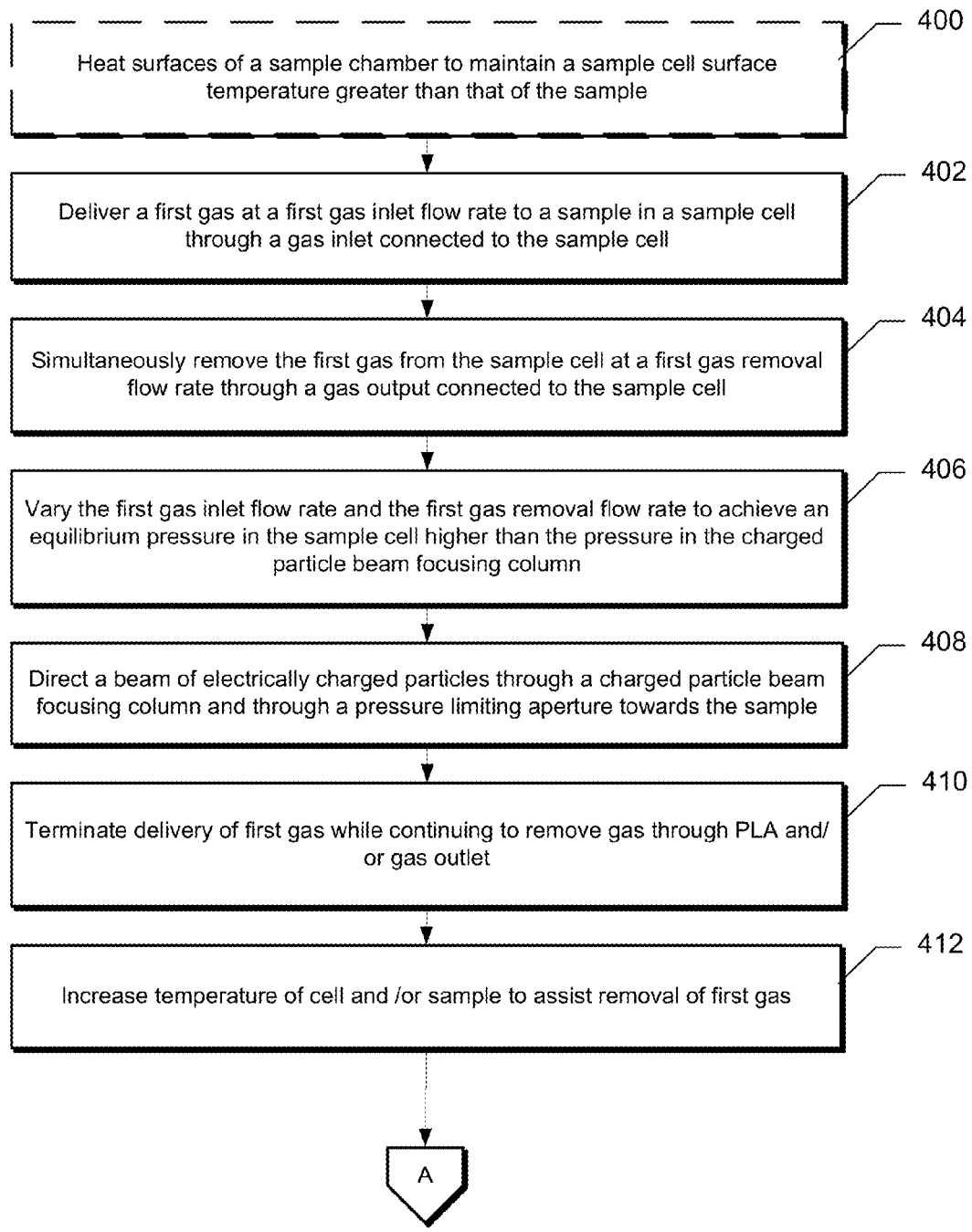
FIGS. 2a and 2b are flow charts showing a method of equilibrating gas pressure in a sample chamber by regulating a gas input and a gas output.
Figure 2B:
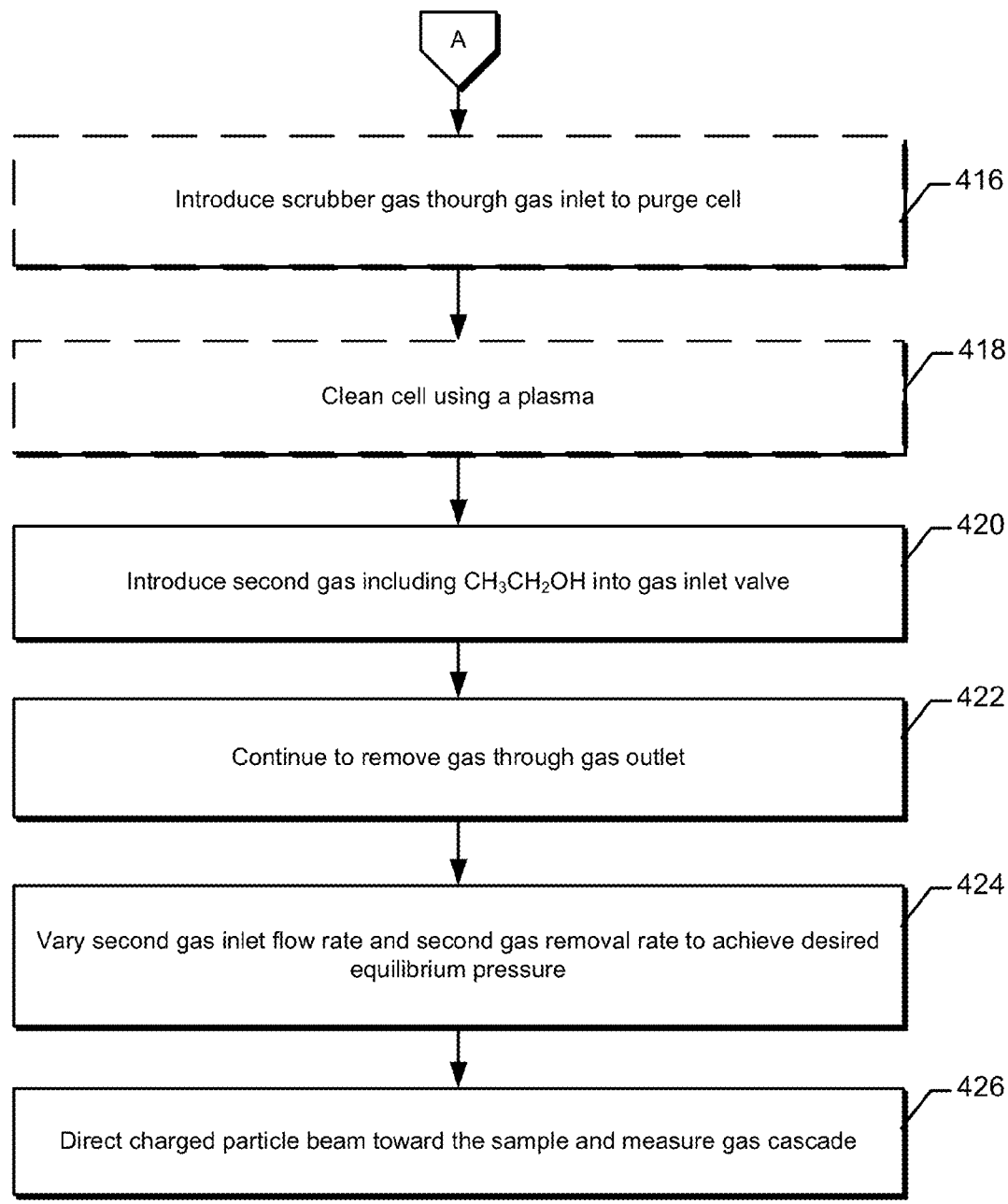

FIGS. 2A and 2B show a method of operating a system in accordance with an example embodiment of the invention. Step 400 of FIG. 2A involves heating the interior wall surfaces of a cell to maintain a sample cell surface temperature greater than that of the sample, and optionally heating the sample through a sample stage. A first process gas or a first imaging gas is delivered at a first gas input flow rate through a gas input into the sample cell in step 402. $CH_3CH_2OH$ may be used as an imaging gas at this step. In step 404, the gas is removed from the sample chamber at a first gas removal flow rate. The gas is removed through a gas output connected to the cell, the gas output preferably being an outlet other than through the pressure limiting aperture. The gas may be removed, for example, by a roughing pump connected to the gas output through a leak valve. The equilibrium pressure in the cell is determined by the gas input flow rate, the gas removal flow rate, and the flow rate from the cell into the column through the pressure limiting aperture. For a high vapor pressure gas source, step 404 can begin at the same time as step 402, whereas for a low vapor pressure source, the gas can be permitted to flow into the cell for a period of time before an outlet valve is opened, thereby allowing pressure in the cell to increase more rapidly.

In step 406, the first gas input flow rate and the first gas removal flow rate are varied to achieve a desired equilibrium pressure in the sample cell higher than the pressure in the charged particle beam focusing column. After the system is characterized, the valve positions required to achieve a specific equilibrium pressure may be known, and it may be possible to omit adjustments after the initial setting. Alternatively, the inlet and outlet valves can be computer controlled to produce the desired equilibrium pressure. In step 408, a beam of electrically charged particles, preferably electrons, is directed through the charged particle beam focusing column and through the pressure limiting aperture to process the sample in the cell.

A gas in any stage of processing may comprise multiple gases or multiple species of gas molecules. For example, an electron-beam-induced deposition can use a partial pressure of 3.5 Pa for styrene, and a partial pressure of 22.5 Pa for nitrogen. The gases can be delivered to the specimen chamber simultaneously. Flow rates can be controlled using needle valves. First, the $N_2$ flow control valve is adjusted to achieve a steady state specimen chamber pressure of roughly 22.5 Pa, the pressure needed to stabilize charging of the substrates used. Then, the styrene flow control valve is opened so as to increase the total pressure to roughly 26 Pa.

After one stage of processing is complete, the gas can be changed out for another processing step. In step 410, the gas delivery into the cell is terminated, and gas continues to be removed from the cell through the PLA and/or through the gas outlet. In step 412, the temperature of the interior cell walls, the sample, or both can optionally be increased as the gas is being removed to assist desorption of gas molecules from the interior surfaces of the cell. In optional step 416 of FIG. 2B, a scrubber gas, for example, $N_2$, is supplied through the gas inlet to further assist in purging the remains of the previous gas from the cell. Optionally, the cell interior surfaces are cleaned by a plasma in the cell in step 418, which can rapidly clean the cell and reduce the time required to switch gases. Plasma cleaning is known in the art and is described for example, in U.S. Pat. No. 6,452,315; and Proc. SPIE Vol. 4344 (2001), 835.

In step 420, a second gas is introduced into the gas inlet valve. In step 422, gas continues to be removed from the sample cell at the first gas removal flow rate. Having switched from the first gas to the second gas in step 420, step 424 involves varying the second gas input flow rate and the second gas removal rate to achieve an equilibrium pressure of the second gas in the sample cell at a pressure higher than the pressure in the charged particle beam focusing column. In step 426, a charged particle beam is directed toward the sample. Step 420 preferably entails delivering the $CH_3CH_2OH$ imaging gas as described herein, or a mixture thereof, and step 426 may entail using the beam to form an image of the sample.

The order and inclusion of the various steps described above will vary with the gases used. For example, molecules that have higher adsorption energies may require longer purge times, along with cell wall heating, scrubber gases, or plasma cleaning operations. Relatively inactive gases, such as $CH_3CH_2OH$, may require neither cell heating nor purge gases in some versions.

The invention can also be used for delocalized processing, that is, etching or depositing that is not induced by the charged particle beam and is not limited to an area adjacent the beam impact point. Setting the sample temperature above that needed for thermal decomposition of a precursor will give rise to deposition or etching of the sample. This can be useful, for example, as one step in a multi-step process, thereby allowing more complete processing in a single vacuum chamber. Processing in a single vacuum chamber eliminates the inefficiencies inherent in multiple venting and evacuating steps, along with the contamination that is introduced when a sample leaves a vacuum chamber.

Figure 3:
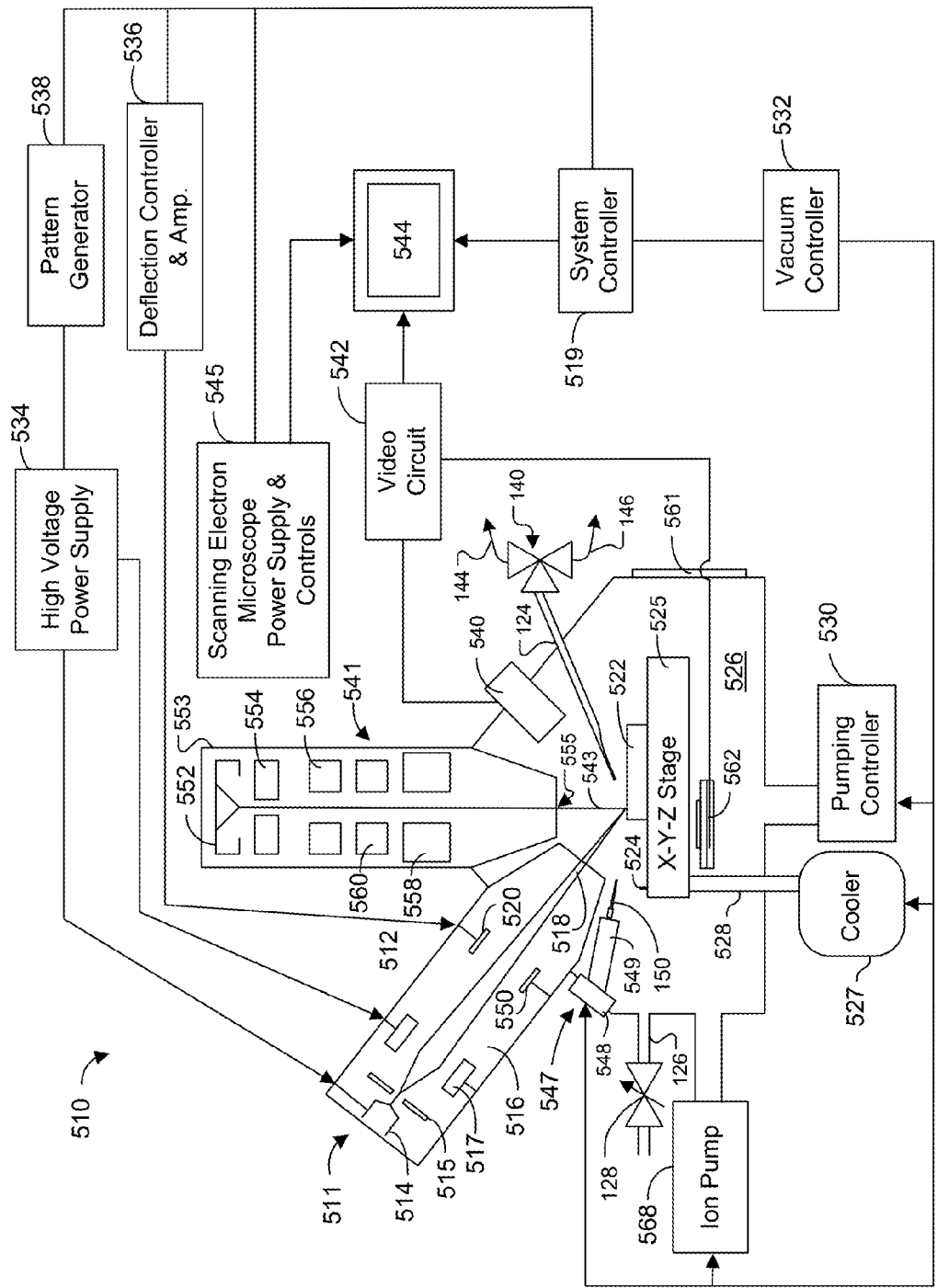
FIG. 3 is a schematic view of a dual beam system employed according to some embodiments of the invention.

FIG. 3 shows a typical dual beam system 510 suitable for practicing other embodiments of the present invention, with a vertically mounted SEM column and a focused ion beam (FIB) column mounted at an angle of approximately 52 degrees from the vertical. Suitable dual beam systems are commercially available, for example, from FEI Company, Hillsboro, Oreg., the assignee of the present application. While an example of suitable hardware is provided below, the invention is not limited to being implemented in any particular type of hardware.

A scanning electron microscope 541, along with power supply and control unit 545, is provided with the dual beam system 510. An electron beam 543 is directed from inside a vacuum envelope 553, the beam being emitted from a cathode 552 by applying voltage between cathode 552 and an anode 554. Electron beam 543 is focused to a fine spot by means of a condensing lens 556 and an objective lens 558. Electron beam 543 passes through at least one pressure limiting aperture 555 and 543 is scanned two-dimensionally on the specimen by means of a deflection coil 560. Operation of condensing lens 556, objective lens 558, and deflection coil 560 is controlled by power supply and control unit 545.

Electron beam 543 can be focused onto substrate 522, which is on movable X-Y stage 525 within variable pressure chamber 526, which in this version is the sample chamber of microscope 526, which may be employed with or without a sample cell such as sample cell 104 described above. Stage 525 preferably is connected to a cooler 527, such as a source of liquid nitrogen or a Peltier cooler, connected to the stage 525 by a thermal conduit 528. In use, when the electrons in the electron beam strike substrate 522, secondary electrons are emitted. These secondary electrons are detected by secondary electron detector 540 as discussed below. STEM detector 562, located beneath the TEM sample holder 524 and the stage 525, can collect electrons that are transmitted through the sample mounted on the TEM sample holder.

Dual beam system 510 also includes focused ion beam (FIB) system 511 which comprises an evacuated chamber having an upper neck portion 512 within which are located an ion source 514 and a focusing column 516 including extractor electrodes and an electrostatic optical system. The axis of focusing column 516 is preferably tilted 52 degrees from the axis of the electron column. The ion column 512 includes an ion source 514, an extraction electrode 515, a focusing element 517, deflection elements 520, and a focused ion beam 518. Ion beam 518 passes from ion source 514 through column 516 and between electrostatic deflection means schematically indicated at 520 toward substrate 522, which comprises, for example, a semiconductor device or other workpiece or sample on movable X-Y stage 525 within variable pressure chamber 526.

Stage 525 can also support one or more TEM sample holders 524 so that a sample can be extracted from the workpiece or sample and moved to a TEM sample holder. Stage 525 can preferably move in a horizontal plane (X and Y axes) and vertically (Z axis). Stage 525 can also tilt approximately sixty (60) degrees and rotate about the Z axis. In some embodiments, a separate TEM sample stage (not shown) can be used. Such a TEM sample stage will also preferably be moveable in the X, Y, and Z axes. A door 561 is opened for inserting substrate 522 onto X-Y stage 525 and also for servicing an internal gas supply reservoir, if one is used. The door is interlocked so that it cannot be opened if the system is under vacuum.

An ion pump 568 is employed for evacuating neck portion 512. The variable pressure chamber 526 is evacuated with turbomolecular and mechanical pumping system 530 under the control of vacuum controller 532. The vacuum system provides within variable pressure chamber 526 a vacuum of between low and high pressures depending on the process and steps implemented in a particular scenario, such as a deposition step followed by a gas imaging step. Preferably, for vacuum pressure operations, the pressure in variable pressure chamber 526 can be varied from vacuum pressures such as approximately $10^{-7}$ Torr and $10^{-4}$ Torr, but preferably less than $10^{-5}$ Torr for typical SEM if an etch assisting, an etch retarding gas, or a deposition precursor gas is used. For HPSEM/VPSEM operations, chamber 526 is further adjustable up to pressures used in HPSEM gas imaging processes described herein, such as 0.01 Torr to 50 Torr, and preferably between 1 Torr and 10 Torr for the gas imaging processes, with the use of $CH_3CH_2OH$ preferably limited to 5 Torr, although higher pressures may be employed with $CH_3CH_2OH$, which may forego the improved gas amplification as described herein, but still achieve the benefits of less corrosion and sample interaction, especially in the cases where samples include organic liquids or materials that are susceptible to oxidation.

The high voltage power supply provides an appropriate acceleration voltage to electrodes in ion beam focusing column 516 for energizing and focusing ion beam 518. When the ion beam strikes substrate 522, material is sputtered, that is physically ejected, from the sample. Alternatively, ion beam 518 can decompose a precursor gas to deposit a material.

High voltage power supply 534 is connected to liquid metal ion source 514 as well as to appropriate electrodes in ion beam focusing column 516 for forming an approximately 1 keV to 60 keV ion beam 518 and directing the same toward a sample. Deflection controller and amplifier 536, operated in accordance with a prescribed pattern provided by pattern generator 538, is coupled to deflection plates 520 whereby ion beam 518 may be controlled manually or automatically to trace out a corresponding pattern on the upper surface of substrate 522. In some systems the deflection plates are placed before the final lens, as is well known in the art. Beam blanking electrodes (not shown) within ion beam focusing column 516 cause ion beam 518 to impact onto a blanking aperture (not shown) instead of substrate 522 when a blanking controller (not shown) applies a blanking voltage to the blanking electrode.

The liquid metal ion source 514 typically provides a metal ion beam of gallium. The source typically is capable of being focused into a sub one-tenth micrometer wide beam at substrate 522 for either modifying the substrate 522 by ion milling, enhanced etching, material deposition, or for the purpose of imaging the substrate 522.

A charged particle detector 540, such as an Everhart Thornley or multi-channel plate, suitably biased, is used for detecting secondary ion or electron emission. A gas cascade detector is included which may be the same detector 540, or a separate structure, and may be any of gas cascade detectors described herein. The detector 540 is connected to a video circuit 542 that supplies drive signals to video monitor 544 and receiving deflection signals from controller 519, forming a gas cascade amplification imaging system. Such a system may also include digital signal processors for processing the resulting data, and local data storage coupled to the video circuit for manipulating the image data received for viewing and analysis. The location of charged particle detector 540 within variable pressure chamber 526 can vary in different embodiments. For example, a charged particle detector 540 can be coaxial with the ion beam and include a hole for allowing the ion beam to pass. In other embodiments, secondary particles can be collected through a final lens and then diverted off axis for collection.

A micromanipulator 547, such as the AutoProbe 200™ from Omniprobe, Inc., Dallas, Tex., or the Model MM3A from Kleindiek Nanotechnik, Reutlingen, Germany, can precisely move objects within the vacuum chamber. Micromanipulator 547 may comprise precision electric motors 548 positioned outside the vacuum chamber to provide X, Y, Z, and theta control of a portion 549 positioned within the vacuum chamber. The micromanipulator 547 can be fitted with different end effectors, such as thin probe 550, for manipulating small objects.

A gas input 124 and a gas output 126 regulate the flow rate and pressure of process or imaging gasses inside the variable pressure chamber 526. A source of a precursor or imaging gas is provided through gas input 124. In this embodiment, the imaging gas provided is $CH_3CH_2OH$ or a mixture thereof. Some embodiments also allow for multiple gasses to be used simultaneously, with $CH_3CH_2OH$ included as an imaging gas to an ongoing process employing one or more process gasses. $CH_3CH_2OH$ may also have a dual role in such situations as an imaging gas and a process gas. Gas output 126 is connected through a leak valve 128 to a roughing pump (not shown). Gas input 124 includes a valve arrangement 140 that allows for rapid switching between multiple gas feeds, such as a one or more process gas feeds 144 and an imaging gas feed 146. Gas input 124 may extend into variable pressure chamber 526 for introducing and directing a gaseous vapor toward substrate 522. U.S. Pat. No. 5,851,413 to Casella et al. for "Gas Delivery Systems for Particle Beam Processing," assigned to the assignee of the present invention, describes a suitable gas delivery system 546. Another gas delivery system is described in U.S. Pat. No. 5,435,850 to Rasmussen for a "Gas Injection System," also assigned to the assignee of the present invention. For example, iodine can be delivered to enhance etching, or a metal organic compound can be delivered to deposit a metal.

A system controller 519 controls the operations of the various parts of dual beam system 510. Through system controller 519, a user can cause ion beam 518 or electron beam 543 to be scanned in a desired manner through commands entered into a conventional user interface (not shown). Alternatively, system controller 519 may control dual beam system 510 in accordance with programmed instructions. In some embodiments, the gas cascade amplification imaging system incorporates image recognition software, such as software commercially available from Cognex Corporation, Natick, Mass., to automatically identify regions of interest, and then the system can manually or automatically extract samples in accordance with the invention.

Embodiments of the invention are also suitable for applications in which the beam is used to observe, relatively passively, gas-sample reactions. The imaging gas techniques disclosed herein are especially useful in imaging of liquids and dynamic processes in non-aqueous environments, where other imaging gasses interfere with processes and cause corrosion. Examples include thermal decomposition of deposition precursors, as in chemical vapor deposition (CVD) and metalorganic chemical vapor deposition (MOCVD), and catalysis processes in which the reactions are initiated by heat.

Figure 4A:
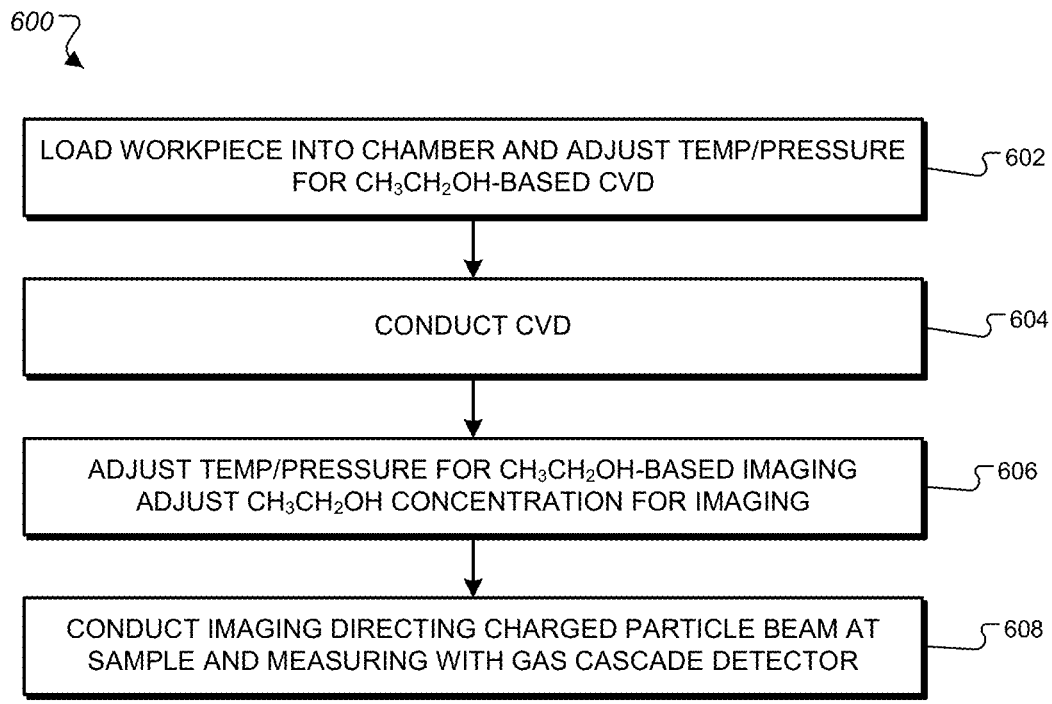
FIG. 4a is a flowchart of a process for using improved gas imaging with CVD.

FIG. 4a is a flowchart of a process for using improved gas imaging that can be used with $CH_3CH_2OH$-based CVD, meaning the gaseous reactants include $CH_3CH_2OH$. An example of a second gaseous reactant that may be mixed with $CH_3CH_2OH$ is $H_2$. A third gas that may be mixed with $CH_3CH_2OH$ is $H_2$ is Ar. The depicted process 600 begins at box 602 where a workpiece is loaded into a variable pressure chamber, which may be a one of the environmental cells described herein, or a sample chamber, for example of the embodiment shown in FIG. 3. The temperature and pressure of the platform, workpiece, chamber and walls are preferably controlled independently, and the partial pressure of each gas involved controlled independently. Next at box 604, the CVD process is conducted, preferably maintaining a steady flow of the reagent gasses. The CVD at this step is conducted according to CVD processes known in the art, with a steady flow of gas at the desired pressure maintained through the chamber and out the leak valve. Typically, during CVD, the gas pressure is between 0.01 mBar and 900 mBar, and the temperature is between 300° C. and 1000° C. Further, while $CH_3CH_2OH$-based CVD is discussed, the use of $CH_3CH_2OH$ as an imaging gas is useful in this context for most organic or non-aqueous CVD synthesis processes, which can replace the CVD described here.

Next, at box 606, the process adjusts the temperature and pressure to prepare for imaging, and may also adjust the concentration of each gas. In some versions, the concentration of $CH_3CH_2OH$ vapor may already be sufficient for imaging, and the imaging may be conducted under the same concentration as the CVD. The temperature will typically be lowered and the pressure adjusted upward or downward, however this is not limiting and some processes may perform imaging under the same conditions as CVD. Optimal imaging is typically performed at temperatures lower than 700° C. and gas pressures in the range of 0.1 mBar and 10 mBar. Certain CVD processes may also be performed with $CH_3CH_2OH$-based imaging occurring during the CVD to measure progress. The imaging may be intermittent or continuous, and may be used to generate movies of the growing materials. Preparing for imaging may also involve moving the workpiece within the variable pressure chamber, but preferably does not involve removing the workpiece from the chamber. Some processes may evacuate the chamber and add the $CH_3CH_2OH$ imaging gas after evacuation, but this is only performed if necessary and the preferred process merely adjusts the concentration of $CH_3CH_2OH$, (without evacuating the chamber) for example by turning off the supply of other gasses in the reactant mixture and increasing the pressure of the supplied $CH_3CH_2OH$. At box 608, the process conducts the imaging as described herein, using one of the particle beam and gas cascade detector devices configured as described herein. Based on the imaging results, the process may repeat iteratively to obtain desired CVD results.

Figure 4B:
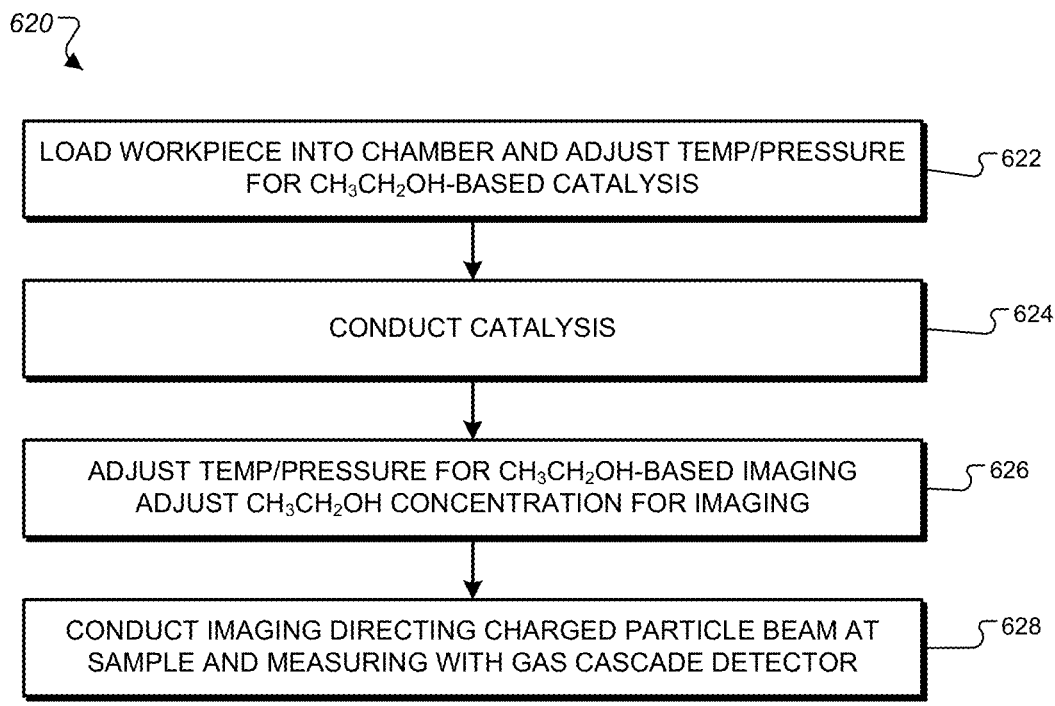
FIG. 4b is a flowchart of a process for using improved gas imaging with catalysis.

FIG. 4b is a flowchart of a process for using improved gas imaging to study a catalysis reaction or the results thereof. The process 620 begins at box 622 where a workpiece is loaded into a variable pressure chamber, which may be an environmental cell or a sample chamber as described. The temperature and pressure of the platform, workpiece, chamber and walls are preferably controlled independently, and the partial pressure or at least the gas feed volume of each gas involved controlled independently. Next at box 624, the catalytic process is conducted, preferably maintaining a steady flow of the reagent gasses. The catalysis at this step is conducted according to catalytic processes known in the art, with a steady flow of gas at the desired pressure maintained through the chamber and out the leak valve. Typically, during catalysis, the gas pressure is between 0.01 mBar and 900 mBar, and the temperature is between 100° C. and 1000° C. Gases used in studies of catalysis include CO, $H_2$, $O_2$, $CH_3CH_2OH$, Ar, $NH_3$, $N_2$ and $H_2O$. Samples used in studies of catalysis include Pt, Au, Ni, Mo and a wide range of oxides. The samples are often composites, nanoparticles or nanostructured surfaces. Next, at box 626, the process adjusts the temperature and pressure to prepare for imaging, and may also adjust the concentration. In some versions, the concentration of $CH_3CH_2OH$ vapor may already be sufficient for imaging, and the imaging may be conducted under the same conditions as the catalysis. Preferably the gas flow or space velocity of the reagent gasses is slowed to conduct imaging. Certain catalytic processes may also be performed with $CH_3CH_2OH$-based imaging occurring intermittently during the catalysis to measure progress. Preparing for imaging may also involve moving the workpiece within the variable pressure chamber, but preferably does not involve removing the workpiece from the chamber. Some processes may evacuate the chamber and add the $CH_3CH_2OH$ imaging gas after, but this is only performed if necessary and the preferred process merely adjusts the concentration of $CH_3CH_2OH$, (without evacuating the chamber) for example by turning off the supply of other gasses in the reactant mixture and increasing the pressure of the supplied $CH_3CH_2OH$. At box 628, the process conducts the imaging as described herein, using one of the particle beams and gas cascade detector devices configured as described herein.

Figure 4C:
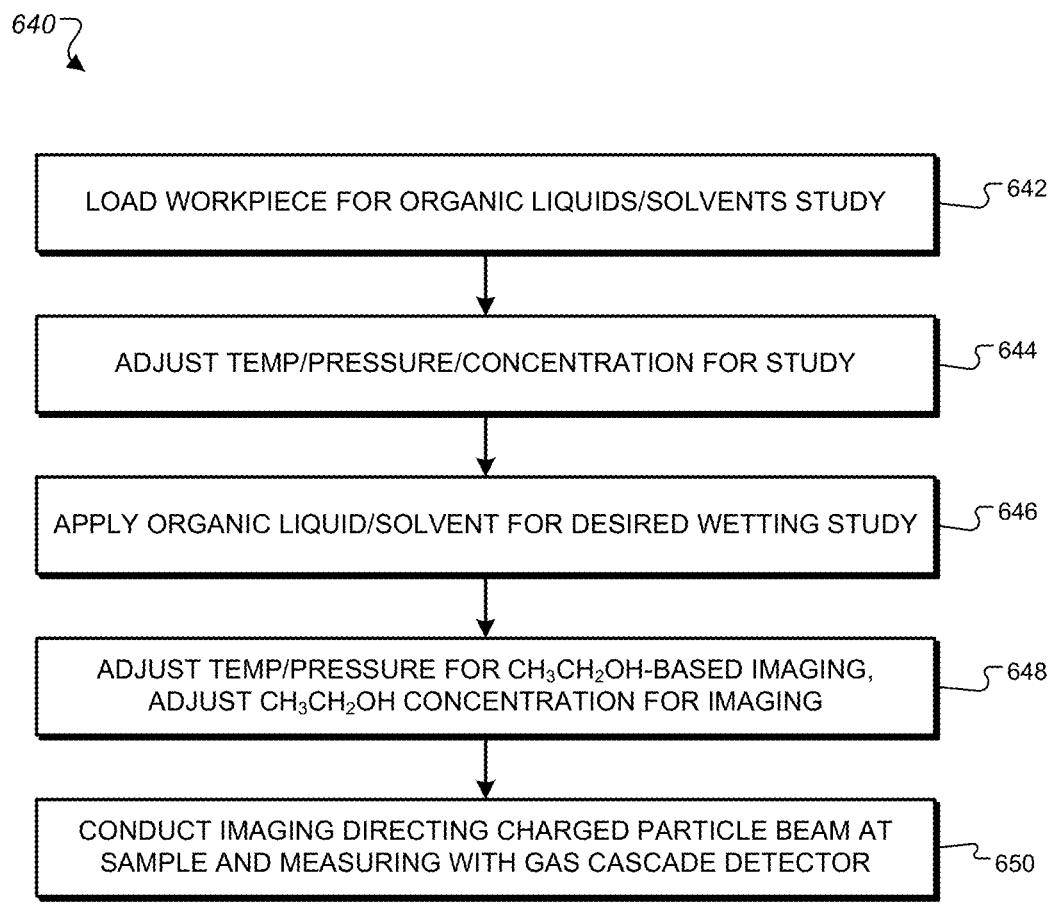
FIG. 4c is a flowchart of a process for using improved gas imaging for studies of organic liquids or solvents and their wetting behavior.
Figure 6:
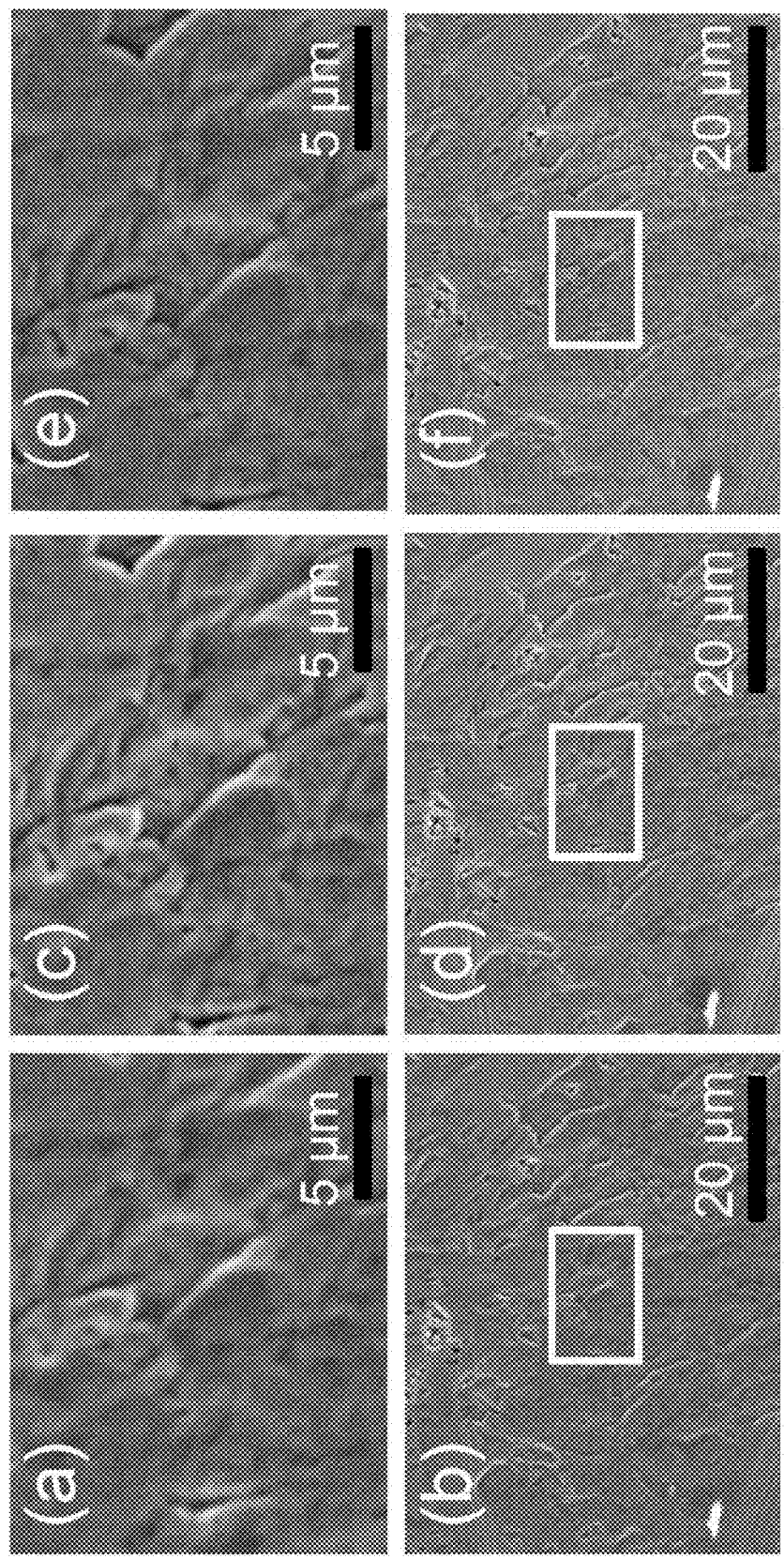
FIG. 6 shows a series of magnified images taken to inspect for unintended carbon deposition with the present system using $CH_3CH_2OH$ as compared $H_2O$ and $NH_3$.

FIG. 4c is a flowchart of a process for using improved gas imaging for studies of organic liquids or solvents and their wetting behavior. The process 640 begins at box 642 where a sample is loaded into a variable pressure chamber for conducting a study of organic liquid or solvent behavior in interaction with the sample. The organic solvent or liquid may optionally be loaded in step 642, or it may be applied subsequently in step 646. The variable pressure chamber may be an environmental cell or a sample chamber as described herein. Next at box 644, the process adjusts the temperature and pressure for the desired study, and may also provide a desired concentration of one or more gasses. Typically, imaging of solvents or liquids requires sample temperatures between −100° C. and 10° C., and organic vapor pressures in the range of 1 mBar and 20 mBar. Next, at box 646, the process optionally applies the organic liquid or solvent required to conduct the desired study. This step may involve adding the liquid or adding a gas using an injector, or lowering the sample temperature to the condensation temperature of the organic and the partial pressure of the organic vapor used in the study. Further, in some versions the organic component desired to be studied is present in the original sample, and a reagent gas provides the interaction desired to be studied. This step may involve waiting for a desired time for a reaction to occur, or the process may go on to step 648 immediately where adjustments are made for $CH_3CH_2OH$-based imaging. Some processes may require no adjustments to temperature, pressure, or various gas concentrations to conduct the imaging, while others may adjust any of these conditions at box 648. $CH_3CH_2OH$ vapor may be injected into the variable pressure chamber to improve imaging during studies of organic liquids or solvents other than $CH_3CH_2OH$. Alternatively, liquid-phase $CH_3CH_2OH$ may be used as the organic solvent or liquid, while $CH_3CH_2OH$ vapor is used simultaneously for imaging. At box 650, the process conducts the imaging as described herein, using one of the particle beam and gas cascade detector devices configured as described herein. The imaging may also be an ongoing observation of the behavior of the organic liquids or solvents in the conditions created at box 644. The techniques described herein are applied beneficially to provide high resolution studies of such behavior, including wetting behavior, for processes not observable with previous gas imaging systems.

FIGS. 5a-c are a series of plots showing environmental photoyield spectroscopy (EPYS) data comparing gas amplification of $CH_3CH_2OH$ configured as described herein with that of prior imaging gasses. The depicted plots reveal changes in the rate that amplification occurs over the range of detector biases. At low pressures and voltages (the region marked (i) in the figures) ions are efficiently separated while little amplification takes place due to the long mean free path and low kinetic energies attained. A sub-exponential increase in the current follows with increasing voltage (ii) which is typical of the Townsend gas capacitor model. At low pressures and high voltages (iii) the effects of feedback are observable as the amplification factor is relatively small, and slowly approaches the reciprocal of the number of electrons generated by positive ions at the surface. When the amplification is large (and increasing quickly) and the feedback small, the contribution to $I_\Sigma$ from feedback rises very quickly over a small voltage range close to breakdown, and is not so readily observed at high voltages in 1-10 Torr. Instead, at high pressures, as depicted in FIG. 5c at the region marked (iv), electron scavenging and elastic scattering by gaseous molecules is observed at 0 V, followed by separation and collection of ions with increasing detector bias, then standard Townsend cascade amplification.

FIGS. 6(a)-(f) show a series of magnified images taken to inspect for unintended carbon deposition with the present system using $CH_3CH_2OH$ as compared to $H_2O$ and $NH_3$. To examine the possibility of unintended carbonaceous deposition resulting from electron beam induced dissociation of $CH_3CH_2OH$ on the sample, the present inventors conducted experiments with all three gasses in a HPSEM device as described. It is noted that $CH_3CH_2OH$ can act as a carbon electron beam-induced deposition (EBID) precursor under certain conditions. However, the C deposition rate was found to be negligible at room temperature under the conditions described herein. Furthermore, the precursor is highly volatile and therefore evacuated rapidly (relative to $H_2O$) from vacuum systems. Magnified images are shown taken following imaging in $H_2O$, $NH_3$ and $CH_3CH_2OH$ in FIGS. 6(a)-(b), 6(c)-(d) and 6(e)-(f) respectively. No contrast change arose from irradiation at high magnification in $CH_3CH_2OH$ which indicates there is little to no carbon deposition occurring when used according to the techniques described herein.

The following are non-limiting, specific embodiments in accordance with the present disclosure:

A first embodiment, which is a method of forming a charged particle beam image of a work piece, comprising:

scanning a charged particle beam over a work piece surface, the charged particle beam causing the emission of secondary electrons to produce secondary electron signals at points along the scan;

amplifying the secondary electron signals by accelerating the secondary electrons through a region including $CH_3CH_2OH$, the secondary electrons initiating an ionization cascade of the $CH_3CH_2OH$;

detecting the amplified imaging signals; and forming an image of the work piece from the amplified imaging signals.

A second embodiment, which is the method of the first embodiment, in which accelerating the secondary electrons through a region including $CH_3CH_2OH$ includes accelerating the secondary electrons through a region including $CH_3CH_2OH$ having a pressure of at least 0.01 torr (0.013 mbar).

Third embodiments, which are methods of the first or second embodiment, in which accelerating the secondary electrons through a region including $CH_3CH_2OH$ includes accelerating the secondary electrons through a region including $CH_3CH_2OH$ having a pressure of between 1.0 torr (1.5 mbar) and 50 torr (67 mbar).

Fourth embodiments, which are methods of any of the first to the third embodiments, in which accelerating the secondary electrons through a region including $CH_3CH_2OH$ includes accelerating the secondary electrons through an electrical potential sufficiently great to amplify the secondary electron signal by at least 500 times and insufficiently great to cause breakdown of the $CH_3CH_2OH$.

Fifth embodiments, which are methods of any of the first embodiment to the fourth, in which accelerating the secondary electrons through a region including $CH_3CH_2OH$ includes accelerating the secondary electrons through an electrical potential of between 50 V and 1000 V.

Sixth embodiment, which are method of any of the first embodiment to the fifth embodiment, in which accelerating the secondary electrons through a region including $CH_3CH_2OH$ includes accelerating the secondary electrons through a distance of between about 1 mm and about 200 mm.

A seventh embodiment, which is a charged particle beam system for imaging a work piece, comprising:

a charged particle source for producing a primary beam of charged particles for irradiating said work piece;

a focusing lens for focusing the charged particles onto the work piece;

an electrode for accelerating secondary electrons generated from the work piece irradiation by the charged practice beam;

a container for enclosing $CH_3CH_2OH$, the electrode accelerating the secondary electrons though the $CH_3CH_2OH$ to ionize the $CH_3CH_2OH$ through ionization cascade to amplify the number of secondary electrons for detection; and a pressure limiting aperture positioned between the container and the charged particle source configured to maintain a lower pressure at the charged particle beam source than in the container.

An eighth embodiment, which is the system of the seventh embodiment, in which the container for enclosing the $CH_3CH_2OH$ comprises a sample chamber.

Ninth embodiments, which are systems of the seventh or eighth embodiment, in which the container for enclosing the $CH_3CH_2OH$ comprises an environmental cell disposed inside a sample chamber.

Tenth embodiments, which are the systems of any of the seventh embodiment to ninth embodiments, further comprising a power supply for providing a potential difference between the electrode and the work piece of between 50 V and 1000 V.

Eleventh embodiments, which are systems of any of the seventh to tenth embodiment, in which the container for enclosing $CH_3CH_2OH$ contains $CH_3CH_2OH$ at a pressure of between 0.01 torr (0.013 mbar) and 50 torr (67 mbar).

Twelfth embodiments, which are systems of any of the seventh to the eleventh embodiments, further comprising:

a current amplifier connected to the electrode; and a current detector connected between the current amplifier and an electrical ground.

A thirteenth embodiment, which is a method for generating, amplifying and detecting secondary electrons from a surface of a workpiece, the method comprising:

(a) providing an imaging gas comprising $CH_3CH_2OH$ in a chamber;

(b) in the presence of the imaging gas, scanning the surface of the workpiece under a suitable gaseous pressure with a charged particle beam having sufficient energy so as to cause secondary electrons to be emitted from the surface of the workpiece;

(c) accelerating the secondary electrons with an electric field of sufficient strength so as to cause them to collide with $CH_3CH_2OH$ gas molecules and produce negative charge carriers which can subsequently produce additional negative charge carriers through multiple collisions with other $CH_3CH_2OH$ gas molecules resulting in a number of negative charge carriers greater than and proportional to the number of original secondary electrons, the strength of the electric field being sufficiently low so as to avoid catastrophic electrical discharging or arcing in the $CH_3CH_2OH$; and (d) detecting electrical current resulting from electrons and ionized gas molecules, thereby detecting a signal proportional to the number of secondary electrons emitted from the surface of the workpiece.

A fourteenth embodiment, which is the method of the thirteenth embodiment, in which the workpiece includes organic liquids or solvents and further comprising generating an image based on the detected electrical currents.

Fifteenth embodiments, which are method of the fourteenth or fifteenth embodiment, in which the image shows wetting behavior of the organic liquids or solvents along the workpiece.

Sixteenth embodiment, which are methods of any of the thirteenth to fifteenth embodiment, further comprising conducting a $CH_3CH_2OH$-based chemical vapor deposition step on the workpiece in the chamber before scanning the surface of the workpiece.

Seventeenth embodiments, which are methods of any of the thirteenth to sixteenths embodiments, further comprising conducting a $CH_3CH_2OH$-based chemical vapor deposition step on the workpiece in the chamber whilst scanning the surface of the workpiece.

Eighteenth embodiments, which are methods of any of the thirteenth to seventeenth embodiments, further comprising conducting a $CH_3CH_2OH$-based catalysis step on the workpiece in the chamber before scanning the surface of the workpiece.

Nineteenth embodiments, which are methods of any of the thirteenth to eighteenth embodiments, further comprising conducting a $CH_3CH_2OH$-based catalysis step on the workpiece in the chamber whilst scanning the surface of the workpiece.

Twentieth embodiments, which is the methods of any of the thirteenth to nineteenth embodiments, wherein the charged particle beam is an electron beam having an energy within the range from about 1 kiloelectron volt to about 50 kiloelectron volts.

Twenty-first embodiments, which are methods of any of the thirteenth to twentieth embodiments, wherein the gaseous pressure is within the range from about 0.01 torr to about 10 torr.

Twenty-second embodiments, which are methods of any of the thirteenth to twenty-first embodiments, wherein the electric field comprises an electrical potential difference of at least 50 volts and less than about 1000 volts.

Twenty-third embodiment, which are method of any of the thirteenth to twenty-second embodiment, wherein providing $CH_3CH_2OH$ an imaging gas comprising further includes providing a mixture of $CH_3CH_2OH$ and $NH_3$.

Use of the term "optionally" with respect to any element of a claim is intended to mean that the subject element is required, or alternatively, is not required. Both alternatives are intended to be within the scope of the claim. Use of the term "may" to introduce features of embodiments of the disclosure (e.g., "In an embodiment, the widget may be connected to a cog,") is intended to mean that embodiments reciting said features are considered to be within the scope of the invention and such embodiments shall be construed as being positively recited by the specification. However, use of the term "may" to introduce features of embodiments is not an indication that embodiments failing to recite said features are considered outside the scope of the invention. Further, although various features of embodiments are described in plural form (e.g., attachment surfaces, localized attractive sites, etc.), embodiments having single instances of said features (e.g., one attachment surface, one localized attractive site, etc.), alone or in combination with single or plural instances of other features, are also contemplated to be within the scope of the invention unless explicitly indicated otherwise. Use of broader terms such as "comprises," "includes," "having," etc. should be understood to provide support for narrower terms such as "consisting of," "consisting essentially of," "comprised substantially of," etc.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Accordingly, the scope of protection is not limited by the description set out above but is only limited by the claims which follow, that scope including all equivalents of the subject matter of the claims. Each and every claim is incorporated into the specification as an embodiment of the present invention. Thus, the claims are a further description and are an addition to the embodiments of the present invention. The discussion of a reference in the Detailed Description of the Embodiments is not an admission that it is prior art to the present invention, especially any reference that may have a publication date after the priority date of this application.

We claim as follows:

1. A method of forming a charged particle beam image of a work piece, comprising:
    scanning a charged particle beam over a work piece surface, the charged particle beam causing the emission of secondary electrons to produce secondary electron signals at points along the scan;
    amplifying the secondary electron signals by accelerating the secondary electrons through a region including $CH_3CH_2OH$, the secondary electrons initiating an ionization cascade of the $CH_3CH_2OH$;
    detecting the amplified imaging signals; and
    forming an image of the work piece from the amplified imaging signals.

2. The method of claim 1 in which accelerating the secondary electrons through a region including $CH_3CH_2OH$ includes accelerating the secondary electrons through a region including $CH_3CH_2OH$ having a pressure of at least 0.01 torr (0.013 mbar).

3. The method of claim 1 in which accelerating the secondary electrons through a region including $CH_3CH_2OH$ includes accelerating the secondary electrons through a region including $CH_3CH_2OH$ having a pressure of between 1.0 torr (1.5 mbar) and 50 torr (67 mbar).

4. The method of claim 1 in which accelerating the secondary electrons through a region including $CH_3CH_2OH$ includes accelerating the secondary electrons through an electrical potential sufficiently great to amplify the secondary electron signal by at least 500 times and insufficiently great to cause breakdown of the $CH_3CH_2OH$.

5. The method of claim 1 in which accelerating the secondary electrons through a region including $CH_3CH_2OH$ includes accelerating the secondary electrons through an electrical potential of between 50 V and 1000 V.

6. The method of claim 1 in which accelerating the secondary electrons through a region including $CH_3CH_2OH$ includes accelerating the secondary electrons through a distance of between about 1 mm and about 200 mm.

7. A method for generating, amplifying and detecting secondary electrons from a surface of a workpiece, the method comprising:
    (a) providing an imaging gas comprising $CH_3CH_2OH$ in a chamber;
    (b) in the presence of the imaging gas, scanning the surface of the workpiece under a suitable gaseous pressure with a charged particle beam having sufficient energy so as to cause secondary electrons to be emitted from the surface of the workpiece;
    (c) accelerating the secondary electrons with an electric field of sufficient strength so as to cause them to collide with $CH_3CH_2OH$ gas molecules and produce negative charge carriers which can subsequently produce additional negative charge carriers through multiple collisions with other $CH_3CH_2OH$ gas molecules resulting in a number of negative charge carriers greater than and proportional to the number of original secondary electrons, the strength of the electric field being sufficiently low so as to avoid catastrophic electrical discharging or arcing in the $CH_3CH_2OH$; and
    (d) detecting electrical current resulting from electrons and ionized gas molecules, thereby detecting a signal proportional to the number of secondary electrons emitted from the surface of the workpiece.

8. The method of claim 7, in which the workpiece includes organic liquids or solvents and further comprising generating an image based on the detected electrical currents.

9. The method of claim 8, in which the image shows wetting behavior of the organic liquids or solvents along the workpiece.

10. The method of claim 7, further comprising conducting a $CH_3CH_2OH$-based chemical vapor deposition step on the workpiece in the chamber before scanning the surface of the workpiece.

11. The method of claim 7, further comprising conducting a $CH_3CH_2OH$-based chemical vapor deposition step on the workpiece in the chamber whilst scanning the surface of the workpiece.

12. The method of claim 7, further comprising conducting a $CH_3CH_2OH$-based catalysis step on the workpiece in the chamber before scanning the surface of the workpiece.

13. The method of claim 7, further comprising conducting a $CH_3CH_2OH$-based catalysis step on the workpiece in the chamber whilst scanning the surface of the workpiece.

14. The method of claim 7, wherein the charged particle beam is an electron beam having an energy within the range from about 1 kiloelectron volt to about 50 kiloelectron volts.

15. The method of claim 7, wherein the gaseous pressure is within the range from about 0.01 torr to about 10 torr.

16. The method of claim 7, wherein the electric field comprises an electrical potential difference of at least 50 volts and less than about 1000 volts.

17. The method of claim 7, wherein providing $CH_3CH_2OH$ an imaging gas comprising further includes providing a mixture of $CH_3CH_2OH$ and $NH_3$.

* * * * *